United States Patent
Kusunoki

(10) Patent No.: US 9,751,989 B2
(45) Date of Patent: Sep. 5, 2017

(54) CONDENSATION CURABLE RESIN COMPOSITION AND SEMICONDUCTOR PACKAGE

(71) Applicant: Shin-Etsu Chemical Co., Ltd., Tokyo (JP)

(72) Inventor: Takayuki Kusunoki, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/361,537

(22) Filed: Nov. 28, 2016

(65) Prior Publication Data

US 2017/0174843 A1    Jun. 22, 2017

(30) Foreign Application Priority Data

Dec. 22, 2015 (JP) .................. 2015-249522
Feb. 18, 2016 (JP) .................. 2016-028902

(51) Int. Cl.
*H01L 23/29* (2006.01)
*C08G 77/52* (2006.01)

(52) U.S. Cl.
CPC ............ *C08G 77/52* (2013.01); *H01L 23/296* (2013.01)

(58) Field of Classification Search
CPC ..... C08G 77/52; C09D 183/14; H01L 23/296; C08L 63/00
See application file for complete search history.

(56) References Cited

U.S. PATENT DOCUMENTS

| | | | |
|---|---|---|---|
| 3,338,870 A | 8/1967 | Nitzsche et al. | |
| 3,350,350 A | 10/1967 | Nitzsche et al. | |
| 6,368,535 B1 | 4/2002 | Katsoulis et al. | |
| 7,176,270 B2 | 2/2007 | Tabei | |
| 2012/0052309 A1* | 3/2012 | Fairbank | C08L 83/04 428/427 |

FOREIGN PATENT DOCUMENTS

| | | |
|---|---|---|
| EP | 1 074 574 A1 | 2/2001 |
| EP | 2 289 978 A1 | 3/2011 |
| GB | 1163029 | 9/1969 |
| JP | 2001-64393 A | 3/2001 |
| JP | 2005-133073 A | 5/2005 |
| JP | 2012-111850 A | 6/2012 |
| JP | 2012-251058 A | 12/2012 |

OTHER PUBLICATIONS

Extended European Search Report dated Jun. 6, 2017, in European Patent Application No. 16202410.3.

* cited by examiner

*Primary Examiner* — Jasmine Clark
(74) *Attorney, Agent, or Firm* — Birch, Stewart, Kolasch & Birch, LLP

(57) ABSTRACT

A condensation curable resin composition comprising a silphenylene oligomer skeleton-bearing organosilicon compound having at least two hydroxyl and/or alkoxy groups per molecule cures into a product having both a satisfactory hardness and crack resistance.

8 Claims, No Drawings

CONDENSATION CURABLE RESIN COMPOSITION AND SEMICONDUCTOR PACKAGE

CROSS-REFERENCE TO RELATED APPLICATION

This non-provisional application claims priority under 35 U.S.C. §119(a) on Patent Application Nos. 2015-249522 and 2016-028902 filed in Japan on Dec. 22, 2015 and Feb. 18, 2016, respectively, the entire contents of which are hereby incorporated by reference.

TECHNICAL FIELD

This invention relates to a condensation curable resin composition, especially comprising an organosilicon compound bearing a silphenylene oligomer skeleton within the molecule, and a semiconductor package encapsulated with the cured composition.

BACKGROUND ART

From the past, condensation curable silicone resin compositions are used as encapsulant for semiconductor chips such as LED because of excellent heat resistance and light resistance. For example, Patent Document 1 describes a condensation curable silicone resin composition which is resistant to sulfide and effective for the protection of bottom silver surface in LED packages. Patent Document 2 describes a condensation curable silicone resin composition having improved adhesion to adherends.

Although condensation curable silicone resin compositions are widely used as the semiconductor encapsulant, their properties are still below the satisfactory level. In particular, LED encapsulants are exposed to not only internal stresses by temperature changes associated with on/off operation of optical semiconductor devices, but also external stresses by changes of ambient temperature and humidity. For the LED encapsulants, not only heat resistance and light resistance, but also crack resistance are important. However, silicone resins obtained by curing prior art condensation curable silicone resin compositions do not withstand stresses by temperature changes, i.e., have poor crack resistance. In general, a countermeasure taken in silicone resin for the purpose of improving crack resistance is by reducing the hardness of resin to make the resin softer so that the stress may be mitigated. However, once the silicone resin is softened, another problem arises that the resin is deformable in shape and sticky on its surface. Such resin products are difficult to handle. Their gas barrier properties are degraded, and LED protection ability is reduced.

For imparting toughness to a cured silicone resin while maintaining hardness, an attempt to incorporate a silphenylene skeleton into a silicone resin is made in Patent Documents 3 and 4. As compared with the general method of establishing a high hardness by increasing the crosslinking density of silicone resin, this method establishes a high hardness by incorporating a silphenylene skeleton into a silicone resin to restrain motion of the polymer chain. The resulting resin has rigidity and hardness. While the method of increasing the crosslinking density generally makes the resin brittle, the method of incorporating a silphenylene skeleton is advantageous in that the resin exerts a toughness without embrittlement because the silphenylene skeleton is linear. However, the method of incorporating a silphenylene monomer into a silicone resin skeleton as described in Patent Documents 3 and 4, achieves weak binding of the molecular chain and thus fails to form a resin having a high hardness and yet satisfactory stress resistance.

CITATION LIST

Patent Document 1: JP-A 2012-251058
Patent Document 2: JP-A 2012-111850
Patent Document 3: JP-A 2001-064393 (U.S. Pat. No. 6,368,535, EP 1074574)
Patent Document 4: JP-A 2005-133073

DISCLOSURE OF INVENTION

An object of the invention is to provide a condensation curable resin composition which cures into a product having a satisfactory hardness and crack resistance, and a semiconductor package encapsulated with the cured composition (or comprising a cured product of the resin composition).

The inventors have found that the above and other objects are attained by using a silphenylene oligomer skeleton-bearing organosilicon compound having at least two hydroxyl and/or alkoxy groups per molecule, represented by the general formula (1):

$$(R^1_3SiO_{0.5})_a(R^1_2SiO)_b(R^1SiO_{1.5})_c(SiO_2)_dZ_e(O_{0.5}R^2)_f \quad (1)$$

wherein $R^1$, $R^2$, Z, a, b, c, d, e and f are as defined below. That is, a condensation curable resin composition comprising the silphenylene oligomer skeleton-bearing organosilicon compound of formula (1) cures into a product having a satisfactory hardness and crack resistance.

In one aspect, the invention provides a condensation curable resin composition comprising (A) a silphenylene oligomer skeleton-bearing organosilicon compound having at least two hydroxyl and/or alkoxy groups per molecule, represented by the general formula (1).

$$(R^1_3SiO_{0.5})_a(R^1_2SiO)_b(R^1SiO_{1.5})_c(SiO_2)_dZ_e(O_{0.5}R^2)_f \quad (1)$$

Herein $R^1$ is independently hydrogen or a $C_1$-$C_{12}$ unsubstituted monovalent hydrocarbon group free of aliphatic unsaturation; Z is independently a group having the formula (2):

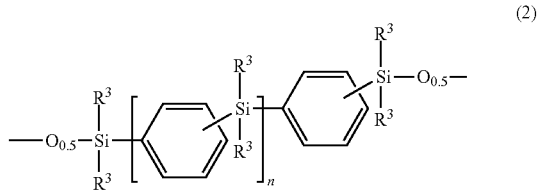

wherein $R^3$ is independently a $C_1$-$C_{12}$ unsubstituted monovalent hydrocarbon group free of aliphatic unsaturation, and n is an integer of 1 to 3; $R^2$ is independently hydrogen or a $C_1$-$C_6$ alkyl group; a is an integer of 0 to 500, b is an integer of 0 to 5,000, c is an integer of 0 to 500, d is an integer of 0 to 500, e is an integer of 1 to 500, and f is an integer of 2 to 100.

In a preferred embodiment, component (A) comprises (A-i) a silphenylene oligomer skeleton-bearing branched organosilicon compound having at least two hydroxyl and/or alkoxy groups per molecule, represented by formula (1) wherein b is an integer of 0 to 1,000, and 1≤c+d≤1,000.

In another preferred embodiment, component (A) comprises (A-ii) a silphenylene oligomer skeleton-bearing linear organosilicon compound having hydroxyl and/or alkoxy groups at both ends of the molecular chain, represented by the general formula (3):

$$(R^1{}_2SiO)_{b'}Z_{e'}(O_{0.5}R^2)_2 \quad (3)$$

wherein $R^1$, $R^2$ and Z are as defined above, b' is an integer of 0 to 5,000, e' is an integer of 1 to 500, and $1 \leq b'+e' \leq 5,001$.

The composition may further comprise (B) an organosilicon compound having at least two hydroxyl and/or alkoxy groups per molecule, represented by the general formula (4).

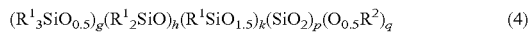
$$(R^1{}_3SiO_{0.5})_g(R^1{}_2SiO)_h(R^1SiO_{1.5})_k(SiO_2)_p(O_{0.5}R^2)_q \quad (4)$$

Herein $R^1$ and $R^2$ are as defined above, g is an integer of 0 to 500, h is an integer of 0 to 5,000, k is an integer of 0 to 500, p is an integer of 0 to 500, q is an integer of 2 to 100, and $1 \leq h+k+p \leq 5,000$, in an amount of 5 to 500 parts by weight per 100 parts by weight of component (A) in total.

In a preferred embodiment, component (B) comprises (B-i) a branched organosilicon compound having at least two hydroxyl and/or alkoxy groups per molecule, represented by formula (4) wherein h is an integer of 0 to 1,000, and $1 \leq k+p \leq 1,000$, in an amount of 50 to 500 parts by weight per 100 parts by weight of component (A) in total.

In another preferred embodiment, component (B) comprises (B-ii) a linear organosilicon compound having hydroxyl and/or alkoxy groups at both ends of the molecular chain, represented by the general formula (5):

$$(R^1{}_2SiO)_{h'}(O_{0.5}R^2)_2 \quad (5)$$

wherein $R^1$ and $R^2$ are as defined above, and h' is an integer of 1 to 5,000, in an amount of 5 to 200 parts by weight per 100 parts by weight of component (A) in total.

The composition may further comprise (C) a condensation catalyst.

Also contemplated herein is a semiconductor package encapsulated with a cured product of the condensation curable resin composition defined above.

Advantageous Effects of Invention

The condensation curable resin composition uses a silphenylene oligomer skeleton-bearing organosilicon compound having repeating silphenylene skeleton units without any intervening siloxane bonds as a base polymer. The composition has toughness because the linear molecular chain becomes rigid and is extended, as compared with the use of a silphenylene monomer skeleton-bearing organosilicon compound or silphenylene-siloxane oligomer. A cured product has both a satisfactory hardness and crack resistance.

DESCRIPTION OF PREFERRED EMBODIMENTS

The notation (Cn-Cm) means a group containing from n to m carbon atoms per group.

One embodiment of the invention is a condensation curable resin composition comprising (A) a silphenylene oligomer skeleton-bearing organosilicon compound having at least two hydroxyl and/or alkoxy groups per molecule, represented by the general formula (1).

(A) Silphenylene Oligomer Skeleton-Bearing Organosilicon Compound

Component (A) is a silphenylene oligomer skeleton-bearing organosilicon compound having at least two hydroxyl and/or alkoxy groups per molecule, represented by the general formula (1).

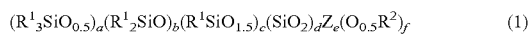
$$(R^1{}_3SiO_{0.5})_a(R^1{}_2SiO)_b(R^1SiO_{1.5})_c(SiO_2)_dZ_e(O_{0.5}R^2)_f \quad (1)$$

Herein $R^1$ is independently hydrogen or a $C_1$-$C_{12}$ unsubstituted monovalent hydrocarbon group free of aliphatic unsaturation. Z is independently a group having the formula (2):

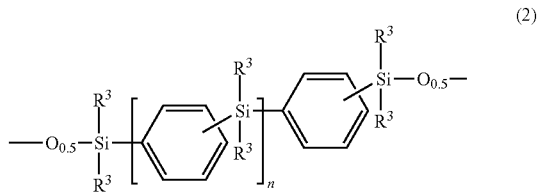

wherein $R^3$ is independently a $C_1$-$C_{12}$ unsubstituted monovalent hydrocarbon group free of aliphatic unsaturation, and n is an integer of 1 to 3. $R^2$ is independently hydrogen or $C_1$-$C_6$ alkyl, a is an integer of 0 to 500, b is an integer of 0 to 5,000, c is an integer of 0 to 500, d is an integer of 0 to 500, e is an integer of 1 to 500, and f is an integer of 2 to 100.

In formula (1), $R^1$ is hydrogen or a $C_1$-$C_{12}$ unsubstituted monovalent hydrocarbon group free of aliphatic unsaturation. Examples include hydrogen, $C_1$-$C_{12}$ monovalent saturated aliphatic hydrocarbon groups, for example, alkyl groups such as methyl, ethyl, propyl, butyl and hexyl, and cycloalkyl groups such as cyclohexyl, and $C_6$-$C_{12}$ monovalent aromatic hydrocarbon groups, for example, aryl groups such as phenyl, tolyl, xylyl and naphthyl and aralkyl groups such as benzyl, phenylethyl and phenylpropyl. Inter alia, methyl and phenyl are preferred.

$R^2$ is hydrogen or $C_1$-$C_6$ alkyl, for example, hydrogen, alkyl groups such as methyl, ethyl, propyl, butyl and hexyl, and cycloalkyl groups such as cyclohexyl. Inter alia, methyl and ethyl are preferred.

$R^3$ is a $C_1$-$C_{12}$ unsubstituted monovalent hydrocarbon group free of aliphatic unsaturation. Examples include $C_1$-$C_{12}$ monovalent saturated aliphatic hydrocarbon groups, for example, alkyl groups such as methyl, ethyl, propyl, butyl and hexyl, and cycloalkyl groups such as cyclohexyl, and $C_6$-$C_{12}$ monovalent aromatic hydrocarbon groups, for example, aryl groups such as phenyl, tolyl, xylyl and naphthyl and aralkyl groups such as benzyl, phenylethyl and phenylpropyl. Inter alia, methyl and phenyl are preferred.

In formula (1), a is an integer of 0 to 500, preferably 0 to 250, and more preferably 0 to 100; b is an integer of 0 to 5,000, preferably 0 to 2,500, and more preferably 0 to 1,000; c is an integer of 0 to 500, preferably 0 to 250, and more preferably 0 to 100; d is an integer of 0 to 500, preferably 0 to 250, and more preferably 0 to 100; e is an integer of 1 to 500, preferably 1 to 250, and more preferably 1 to 100; f is an integer of 2 to 100, preferably 2 to 75, and more preferably 2 to 50; and n is an integer of 1 to 3, preferably 1.

The organosilicon compound may be prepared by any well-known methods. For example, it may be obtained from (co)hydrolytic condensation of a silphenylene oligomer having a hydrolyzable or hydroxyl group with a hydrolyzable silane or siloxane by a standard method. The silphenylene oligomer having a hydrolyzable or hydroxyl group is represented by the general formula (8):

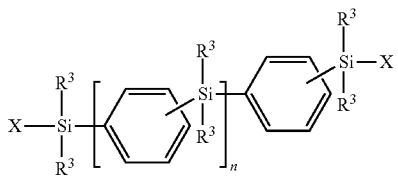
(8)

wherein $R^3$ and n are as defined above, and X is a hydrolyzable or hydroxyl group. A silphenylene oligomer having formula (8) wherein X is $OR^2$ wherein $R^2$ is as defined above may be used as component (A) without further modification.

In formula (8), examples of the hydrolyzable group X include $C_1$-$C_{10}$, preferably $C_1$-$C_6$ alkoxy groups such as methoxy, ethoxy, propoxy and butoxy, $C_2$-$C_{10}$ alkoxyalkoxy groups such as methoxymethoxy and methoxyethoxy, $C_1$-$C_{10}$ acyloxy groups such as acetoxy, $C_2$-$C_{10}$ alkenyloxy groups such as isopropenoxy, and halogen atoms such as chlorine, bromine and iodine. Preferably X is hydroxyl, chlorine, methoxy or ethoxy.

Examples of the silphenylene oligomer having formula (8) are given below.

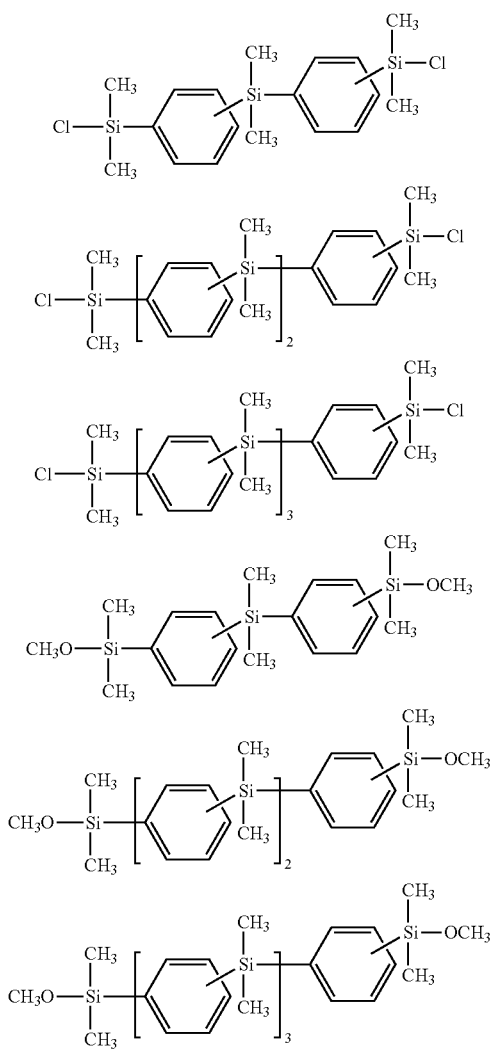

-continued

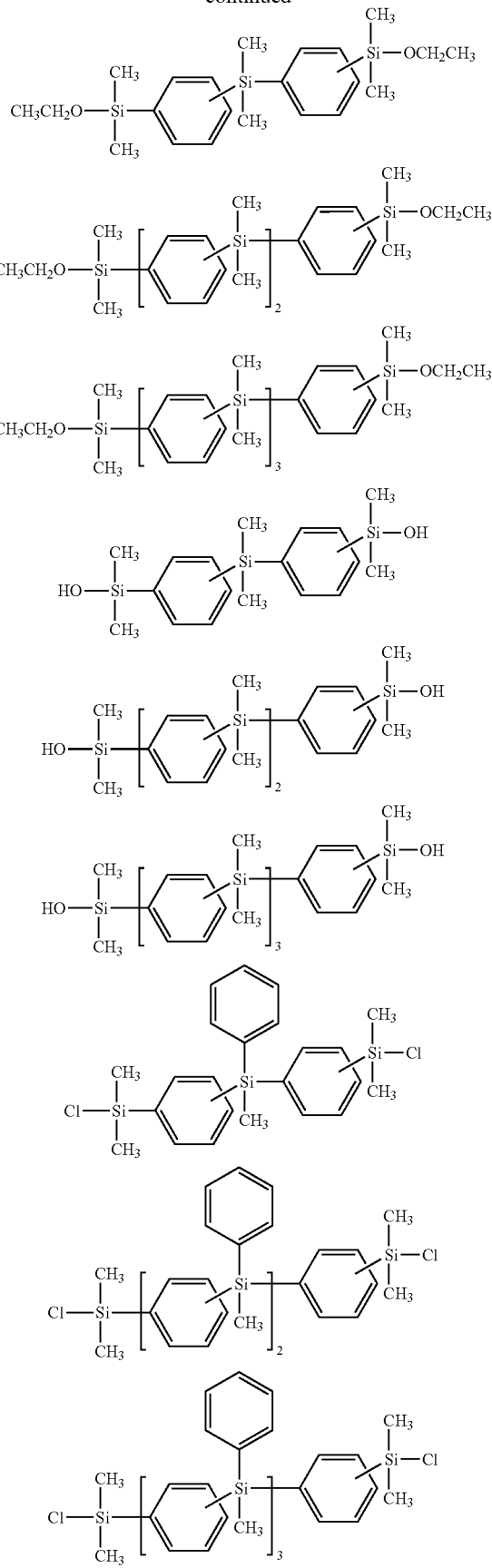

-continued

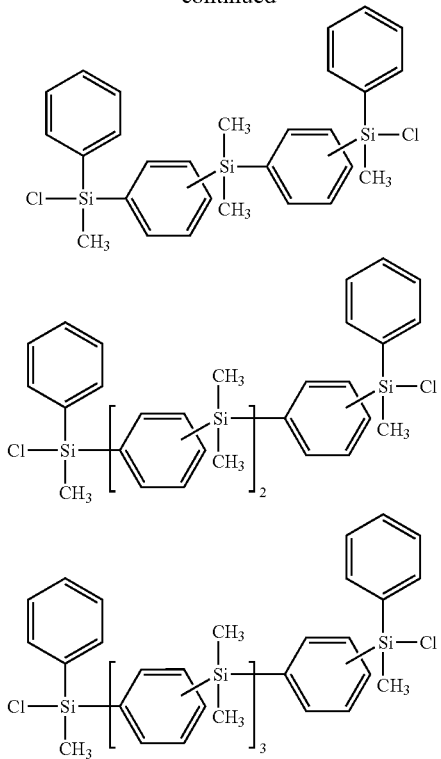

Component (A) may be used alone or in admixture of two or more. Of the silphenylene oligomer skeleton-bearing organosilicon compounds having at least two hydroxyl and/or alkoxy groups per molecule as component (A), (A-i) a branched organosilicon compound and/or (A-ii) a linear organosilicon compound is preferable.

(A-i) Silphenylene Oligomer Skeleton-Bearing Branched Organosilicon Compound Having at Least Two Hydroxyl and/or Alkoxy Groups Component (A-i) is a silphenylene oligomer skeleton-bearing branched organosilicon compound having at least two hydroxyl and/or alkoxy groups per molecule, represented by formula (1) wherein b is an integer of 0 to 1,000, and 1≤c+d≤1,000. Herein, $R^1$, $R^2$, Z, a, c, d, e and f are the same as defined above, b is an integer of 0 to 1,000, preferably 0 to 500, and more preferably 0 to 250, and 1≤c+d≤1,000, preferably 5≤c+d≤750, and more preferably 10≤c+d≤500.

(A-ii) Silphenylene Oligomer Skeleton-Bearing Linear Organosilicon Compound Having Hydroxyl and/or Alkoxy Groups Component (A-ii) is a silphenylene oligomer skeleton-bearing linear organosilicon compound having hydroxyl and/or alkoxy groups at both ends of the molecular chain, represented by the general formula (3):

  (3)

wherein $R^1$, $R^2$ and Z are as defined above, b' is an integer of 0 to 5,000, e' is an integer of 1 to 500, and 1≤b'+e'≤5,001.

In formula (3), $R^1$, $R^2$ and Z are the same as defined above; b' is an integer of 0 to 5,000, preferably 0 to 2,500, and more preferably 0 to 1,000; e' is an integer of 1 to 500, preferably 1 to 300, and more preferably 1 to 100; and 1≤b'+e'≤5,001, preferably 1≤b'+e'≤2,500 and more preferably 1≤b'+e'≤1,000.

Components (A-i) and (A-ii) may be used at the same time. When a mixture of components (A-i) and (A-ii) is used, 100 parts by weight of component (A-i) is preferably combined with 5 to 500 parts by weight, more preferably 10 to 300 parts by weight of component (A-ii).

While component (A) is essential to the inventive composition, component (B) may be optionally used in combination. Particularly when component (A) is (A-i) a branched organosilicon compound, a combination thereof with (B-ii) a linear organopolysiloxane is preferred. When component (A) is (A-ii) a linear organosilicon compound, a combination thereof with (B-i) a branched organopolysiloxane is preferred. Notably component (B) may be used alone or in admixture.

(B) Organosilicon Compound Having at Least Two Hydroxyl and/or Alkoxy Groups

Component (B) is an organosilicon compound having at least two hydroxyl and/or alkoxy groups per molecule, represented by the general formula (4):

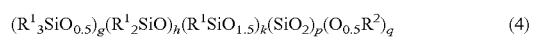  (4)

wherein $R^1$ and $R^2$ are as defined above, g is an integer of 0 to 500, h is an integer of 0 to 5,000, k is an integer of 0 to 500, p is an integer of 0 to 500, q is an integer of 2 to 100, and 1≤h+k+p≤5,000.

In formula (4), $R^1$ and $R^2$ are the same as defined above. The subscript g is an integer of 0 to 500, preferably 0 to 250, and more preferably 0 to 100; h is an integer of 0 to 5,000, preferably 0 to 2,500, and more preferably 0 to 1,000; k is an integer of 0 to 500, preferably 0 to 250, and more preferably 0 to 100; p is an integer of 0 to 500, preferably 0 to 250, and more preferably 0 to 100; q is an integer of 2 to 100, preferably 2 to 75, and more preferably 2 to 50; and 1≤h+k+p≤5,000, preferably 5≤h+k+p≤2,500, and more preferably 10≤h+k+p≤1,000.

An amount of component (B) used is preferably 5 to 500 parts by weight, more preferably 10 to 300 parts by weight per 100 parts by weight of component (A) in total. Within the range, component (B) does not adversely affect the crack resistance improving effect of component (A).

(B-i) Branched Organosilicon Compound Having at Least Two Hydroxyl and/or Alkoxy Groups Component (B-i) is a branched organosilicon compound having at least two hydroxyl and/or alkoxy groups per molecule, represented by formula (4) wherein h is an integer of 0 to 1,000, and 1≤k+p≤1,000. Herein, $R^1$, $R^2$, g, k, p, q and h+k+p are the same as defined above, h is an integer of 0 to 1,000, preferably 0 to 500, and more preferably 0 to 250; and 1≤k+p≤1,000, preferably 5≤k+p≤750, and more preferably 10≤k+p≤500.

An amount of component (B-i) is preferably 50 to 500 parts by weight, more preferably 100 to 300 parts by weight per 100 parts by weight of component (A) in total.

(B-ii) Linear Organosilicon Compound Having Hydroxyl and/or Alkoxy Groups at Both Ends Component (B-ii) is a linear organosilicon compound having hydroxyl and/or alkoxy groups at both ends of the molecular chain, represented by the general formula (5):

  (5)

wherein $R^1$ and $R^2$ are as defined above, and h' is an integer of 1 to 5,000, preferably 5 to 2,500, and more preferably 10 to 1,000.

An amount of component (B-ii) used is preferably 5 to 200 parts by weight, more preferably 10 to 100 parts by weight per 100 parts by weight of component (A) in total.

(C) Condensation Catalyst

In the resin composition, (C) a condensation catalyst may be added for the purpose of increasing the curing rate. The catalyst is not particularly limited as long as it can promote condensation reaction of component (A) and optional component (B). The catalyst may be selected from well-known ones. Suitable condensation catalysts are those containing a metal such as tin, lead, antimony, iron, cadmium, barium, manganese, zinc, chromium, cobalt, nickel, aluminum, magnesium, hafnium, gallium, germanium and zirconium. These metals may take alkoxide, ester, and chelate forms. Typical catalysts are organic tin catalysts including alkyltin ester compounds such as dibutyltin dioctoate, dibutyltin diacetate, dibutyltin dimaleate, dibutyltin dilaurate, and butyltin 2-ethylhexoate, 2-ethylhexoates of iron, cobalt, manganese, lead and zinc, and aluminum chelates such as aluminum bisethylacetoacetate monoacetylacetonate.

As the condensation catalyst, titanate and zirconate catalysts are also useful. Suitable titanate catalysts are compounds of the formula: $Ti(OR^4)_4$ wherein $R^4$ is each independently a primary, secondary or tertiary $C_1$-$C_{10}$ monovalent aliphatic hydrocarbon group. The monovalent aliphatic hydrocarbon group may be linear or branched and optionally contain an unsaturated bond. Typical examples of $R^4$ include, but are not limited to, methyl, ethyl, propyl, isopropyl, butyl, tertiary alkyl groups such as tert-butyl, and branched secondary alkyl groups such as 2,4-dimethyl-3-pentyl. Preferably all $R^4$ are isopropyl, branched secondary alkyl or tertiary alkyl groups, especially tert-butyl. The titanate and zirconate catalysts may take chelate forms. Suitable chelating agents are alkyl acetonates such as methyl or ethyl acetylacetonate.

The amount of component (C) used is not particularly limited and may be a catalytic amount. The catalytic amount is a sufficient amount for condensation reaction to take place and may be determined as appropriate in accordance with the desired cure rate. An appropriate amount of component (C) is 0.01 to 3 parts by weight per 100 parts by weight of components (A) and (B) combined.

In addition to the above components (A) to (C), the condensation curable resin composition may include optional additives such as phosphor, inorganic filler, adhesive aid, and cure inhibitor. These additives are described below.

Phosphor

The phosphor used herein is not particularly limited and any well-known phosphors may be used. One preferred example is the phosphor capable of absorbing light from a semiconductor chip, typically a semiconductor LED including a light-emissive layer of nitride semiconductor and converting it to light of different wavelength. Suitable such phosphors include nitride base phosphors and oxynitride base phosphors which are activated mainly with a lanthanoid element such as Eu or Ce; alkaline earth metal halide apatite phosphors which are activated mainly with a lanthanoid element such as Eu or a transition metal element such as Mn, alkaline earth metal borate halide phosphors, alkaline earth metal aluminate phosphors, alkaline earth metal silicate phosphors, alkaline earth metal sulfide phosphors, alkaline earth metal thiogallate phosphors, alkaline earth metal silicon nitride phosphors, and germanate phosphors; rare earth aluminate phosphors which are activated mainly with a lanthanoid element such as Ce; rare earth silicate phosphors; organic and organic complex phosphors which are activated mainly with a lanthanoid element such as Eu; and Ca—Al—Si—O—N oxynitride glass phosphors, which may be used alone or in admixture.

Exemplary of the nitride phosphors which are activated mainly with a lanthanoid element such as Eu or Ce are $M_2Si_5N_8$:Eu wherein M is at least one element selected from Sr, Ca, Ba, Mg, and Zn. Also included are $MSi_7N_{10}$:Eu, $M_{1.8}Si_5O_{0.2}N_8$:Eu, and $M_{0.9}Si_7O_{0.1}N_{10}$:Eu wherein M is at least one element selected from Sr, Ca, Ba, Mg, and Zn.

Exemplary of the oxynitride phosphors which are activated mainly with a lanthanoid element such as Eu or Ce are $MSi_2O_2N_2$:Eu wherein M is at least one element selected from Sr, Ca, Ba, Mg, and Zn.

Exemplary of the alkaline earth metal halide apatite phosphors which are activated mainly with a lanthanoid element such as Eu or a transition metal element such as Mn are $M_5(PO_4)_3X'$:R' wherein M is at least one element selected from Sr, Ca, Ba, Mg, and Zn, X' is at least one element selected from F, Cl, Br and I, and R' is Eu, Mn, or Eu and Mn.

Exemplary of the alkaline earth metal borate halide phosphors are $M_2B_5O_9X'$:R' wherein M is at least one element selected from Sr, Ca, Ba, Mg, and Zn, X' is at least one element selected from F, Cl, Br and I, and R' is Eu, Mn, or Eu and Mn.

Exemplary of the alkaline earth metal aluminate phosphors are $SrAl_2O_4$:R', $Sr_4Al_{14}O_{25}$:R', $CaAl_2O_4$:R', $BaMg_2Al_{16}O_{27}$:R', $BaMg_2Al_{16}O_{12}$:R' and $BaMgAl_{10}O_{17}$:R' wherein R' is Eu, Mn, or Eu and Mn.

Exemplary of the alkaline earth metal sulfide phosphors are $La_2O_2S$:Eu, $Y_2O_2S$:Eu and $Gd_2O_2S$:Eu.

Exemplary of the rare earth aluminate phosphors which are activated mainly with a lanthanoid element such as Ce are YAG base phosphors of the compositional formulae: $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y,Gd)_3(Al,Ga)_5O_{12}$:Ce. Also included are variants of the foregoing wherein Y is partly or entirely replaced by Tb or Lu, such as $Tb_3Al_5O_{12}$:Ce and $Lu_3Al_5O_{12}$:Ce.

Other suitable phosphors include ZnS:Eu, $Zn_2GeO_4$:Mn, and $MGa_2S_4$:Eu wherein M is at least one element selected from Sr, Ca, Ba, Mg, and Zn.

In the above phosphors, at least one element selected from Tb, Cu, Ag, Au, Cr, Nd, Dy, Co, Ni and Ti may be incorporated instead of Eu or in addition to Eu, if desired.

The Ca—Al—Si—O—N oxynitride glass phosphors are Phosphors based on an oxynitride glass matrix consisting of 20 to 50 mol % of $CaCO_3$ (calculated as CaO), 0 to 30 mol % of $Al_2O_3$, 25 to 60 mol % of SiO, 5 to 50 mol % of AlN, and 0.1 to 20 mol % of a rare earth oxide or transition metal oxide, the total of five ingredients being 100 mol %. In the phosphors based on an oxynitride glass matrix, the nitrogen content is preferably up to 15 mol %, and besides the rare earth oxide ion, another rare earth ion serving as a sensitizer is preferably contained in the phosphor glass in a content of 0.1 to 10 mol % of rare earth oxide as a co-activator.

Phosphors other than the foregoing may also be used as long as they have equivalent functions and effects.

The phosphor takes the form of particles having an average particle size of preferably at least 10 nm, more preferably 10 nm to 10 μm, and even more preferably 10 nm to 1 μm. Notably, the average particle size is measured by a particle size distribution measurement system CILAS using the laser light diffraction method.

When added, the amount of the phosphor is preferably 0.1 to 2,000 parts, more preferably 0.1 to 100 parts by weight per 100 parts by weight of the other components, typically components (A) to (C) combined.

Inorganic Filler

Suitable inorganic fillers include silica, fumed silica, fumed titanium dioxide, alumina, calcium carbonate, calcium silicate, titanium dioxide, ferric oxide, and zinc oxide, which may be used alone or in admixture. When added, the amount of the filler is preferably up to 20 parts, more preferably 0.1 to 10 parts by weight per 100 parts by weight of components (A) to (C) combined, but not limited thereto.

Adhesive Aid

An adhesive aid may be added to the resin composition for imparting adhesion thereto, if desired. Suitable adhesive aids are organosiloxane oligomers having per molecule at least two, preferably three silicon-bonded functional groups selected from alkenyl, alkoxy and epoxy groups. The organosiloxane oligomers preferably have 4 to 50 silicon atoms, more preferably 4 to 20 silicon atoms. These oligomers differ from components (A) and (B) in that they contain alkenyl or epoxy groups.

Also useful as the adhesive aid are organooxysilyl-modified isocyanurate compounds having the formula (6) below and hydrolytic condensates thereof (i.e., organosiloxane-modified isocyanurate compounds).

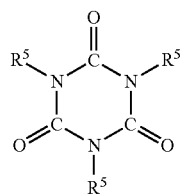

(6)

In formula (6), $R^5$ is each independently an organic group having the formula (7) below, or a monovalent unsaturated aliphatic hydrocarbon group which may contain an oxygen atom, with the proviso that at least one $R^5$ is an organic group of formula (7).

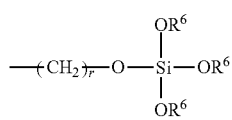

(7)

Herein $R^6$ is hydrogen or a $C_1$-$C_6$ monovalent hydrocarbon group such as methyl or ethyl, and r is an integer of 1 to 6, preferably 1 to 4.

In formula (6), the monovalent unsaturated aliphatic hydrocarbon group represented by $R^5$ may optionally contain oxygen, and is preferably selected from hydrocarbon groups of 2 to 8 carbon atoms, more preferably 2 to 6 carbon atoms, for example, linear or branched alkenyl groups such as vinyl, allyl, 1-butenyl, 1-hexenyl and 2-methylpropenyl, and (meth)acrylic groups.

When added, the amount of the adhesive aid is preferably up to 10 parts, more preferably 0.1 to 8 parts, and even more preferably 0.2 to 5 parts by weight per 100 parts by weight of components (A) to (C) combined. As long as the amount is within the range, adhesion is improved at no sacrifice of the benefits of the invention.

Other Additives

Besides the above components, other additives may be added to the resin composition. Suitable additives include a radical scavenger, flame retardant, surfactant, photostabilizer, thickener, plasticizer, antioxidant, heat stabilizer, conductive agent, antistatic agent, radiation shielding agent, nucleating agent, phosphorus peroxide decomposing agent, lubricant, pigment, metal inactivating agent, physical property regulator, and organic solvent. These optional additives may be used alone or in admixture.

The simplest embodiment of the condensation curable resin composition is a composition consisting of components (A) and (C). Particularly when it is desired that a cured product have high transparency, the composition should preferably be free of an inorganic filler such as silica filler. Examples of the inorganic filler are as described above.

The method for preparing the condensation curable resin composition is not particularly limited. The composition may be prepared by any prior art well-known methods, for example, by mixing components (A) to (C), and optional components in a standard way. For example, the components are fed into a commercially available mixer (e.g., Thinky Conditioning Mixer by Thinky Corp.) where they are mixed for about 1 to 5 minutes until uniform.

The method for curing the condensation curable resin composition is not particularly limited. The composition may be cured by any prior art well-known methods, for example, by heating at 60 to 200° C. for about 1 to 48 hours. Preferably the composition is cured stepwise over a temperature range from 60° C. to 200° C. The stepwise curing includes two steps, for example. The resin composition is heated at a temperature of 60 to 100° C. for 0.5 to 4 hours for achieving full deaeration before it is heated at a temperature of 120 to 200° C. for 1 to 48 hours for heat curing. Such stepwise curing ensures that even when the composition to be cured is thick walled, it is fully cured into a colorless transparent product without bubbles. The term "colorless transparent product" means that a cured part of 1 mm thick has a light transmittance of at least 80%, preferably at least 85%, and most preferably at least 90% at wavelength 450 nm.

Since the condensation curable resin composition cures into a product having a high light transmittance, it is suited for the encapsulation of LED chips, especially blue and purple LED chips. An LED chip or microelectronic device may be encapsulated with the condensation curable resin composition by any prior art well-known methods, for example, dispensing or compression molding.

Since the condensation curable resin composition cures into a product having crack resistance, heat resistance, light resistance and transparency, it is also suited in a variety of applications including display materials, optical recording media materials, optical equipment materials, optical part materials, optical fiber materials, optoelectronic functional organic materials, and semiconductor IC-related materials.

EXAMPLE

Examples of the invention are given below by way of illustration and not by way of limitation. In Examples, all parts are by weight (pbw) unless otherwise indicated.

Components (A) to (D) used in Examples have the following structures. Me stands for methyl, Et for ethyl, iPr for isopropyl, Ph for phenyl, and Z, Z' and Y have the following formulae.

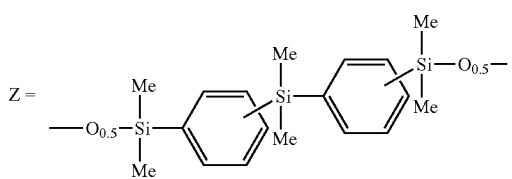

-continued $$Z' = \text{—}O_{0.5}\text{—Si(Me)(Me)—}\left[\text{—C}_6\text{H}_4\text{—Si(Me)(Me)—}\right]_2\text{—C}_6\text{H}_4\text{—Si(Me)(Me)—}O_{0.5}\text{—}$$

$$Y = \text{—}O_{0.5}\text{—Si(Me)(Me)—C}_6\text{H}_4\text{—Si(Me)(Me)—}O_{0.5}\text{—}$$

(A-1) Branched organosilicon compound of the formula below (Shin-Etsu Chemical Co., Ltd.)

$$(Me_3SiO_{0.5})_4(PhSiO_{1.5})_{16}Z_3(O_{0.5}H)_4$$

(A-2) Branched organosilicon compound of the formula below (Shin-Etsu Chemical Co., Ltd.)

$$(Me_3SiO_{0.5})_5(Me_2SiO)_{100}(PhSiO_{1.5})_{15}Z_4(O_{0.5}H)_4$$

(A-3) Branched organosilicon compound of the formula below (Shin-Etsu Chemical Co., Ltd.)

$$(Me_3SiO_{0.5})_{30}(SiO_2)_{45}Z_5(O_{0.5}R)_6 \quad R=H \text{ or } iPr$$

(A-4) Branched organosilicon compound of the formula below (Shin-Etsu Chemical Co., Ltd.)

$$(Me_3SiO_{0.5})_{180}(SiO_2)_{180}Z_{40}(O_{0.5}R)_{60} \quad R=H \text{ or } Et$$

(A-5) Branched organosilicon compound of the formula below (Shin-Etsu Chemical Co., Ltd.)

$$(Me_3SiO_{0.5})_{30}(Me_2SiO)_{30}(MeSiO_{1.5})_{190}Z_{20}(O_{0.5}R)_{50} \quad R=H \text{ or } Me$$

(A-6) Linear organosilicon compound of the formula below (Shin-Etsu Chemical Co., Ltd.)

$$RO_{0.5}\text{—}Z\text{—}O_{0.5}R \quad R=Me$$

(A-7) Linear organosilicon compound of the formula below (Shin-Etsu Chemical Co., Ltd.)

$$RO_{0.5}\text{—}Z'\text{—}O_{0.5}R \quad R=Me$$

(A-8) Linear organosilicon compound of the formula below (Shin-Etsu Chemical Co., Ltd.)

$$HO_{0.5}\text{-}(PhMeSiO)_{28}Z_2\text{—}O_{0.5}H$$

(A-9) Linear organosilicon compound of the formula below (Shin-Etsu Chemical Co., Ltd.)

$$RO_{0.5}\text{-}(Me_2SiO)_{300}Z_{45}\text{—}O_{0.5}R \quad R=H \text{ or } Me$$

(A-10) Linear organosilicon compound of the formula below (Shin-Etsu Chemical Co., Ltd.)

$$RO_{0.5}\text{-}(Me_2SiO)_{1980}Z_{495}\text{—}O_{0.5}R \quad R=H \text{ or } Me$$

(B-1) Branched silicone of the formula below (Shin-Etsu Chemical Co., Ltd.)

$$(Me_3SiO_{0.5})_5(PhSiO_{1.5})_{18}(O_{0.5}H)_3$$

(B-2) Branched silicone of the formula below (Shin-Etsu Chemical Co., Ltd.)

$$(Me_3SiO_{0.5})_{30}(SiO_2)_{45}(O_{0.5}R)_4 \quad R=H \text{ or } iPr$$

(B-3) Linear silicone of the formula below (Shin-Etsu Chemical Co., Ltd.)

$$HO\text{-}(PhMeSiO)_{30}\text{—}H$$

(B-4) Linear silicone of the formula below (Shin-Etsu Chemical Co., Ltd.)

$$RO\text{-}(Me_2SiO)_{300}\text{—}R \quad R=H \text{ or } Me$$

(C) Condensation catalyst: Orgatix® TC-750 (ethylacetoacetate titanate, Matsumoto Fine Chemical Co., Ltd., Ti content 11.2 wt %)

(D-1) Branched silicone of the formula below (Shin-Etsu Chemical Co., Ltd.)

$$(Me_3SiO_{0.5})_4(PhSiO_{1.5})_{16}Y_3(O_{0.5}H)_4$$

(D-2) Linear silicone of the formula below (Shin-Etsu Chemical Co., Ltd.)

$$HO_{0.5}\text{-}(PhMeSiO)_{28}Y_2\text{—}O_{0.5}H$$

Examples 1 to 9 and Comparative Examples 1 to 3

Curable resin compositions were prepared by mixing the components exclusive of the catalyst (C) in the amounts shown in Tables 1 and 2, adding an amount of the catalyst (C), and further mixing them. These resin compositions were examined by the following tests.

(1) Viscosity of Resin Composition

A viscosity at 23° C. of the curable resin composition was measured according to JIS Z 8803:2011 by a Brookfield viscometer.

(2) Hardness of Cured Product

The resin composition was cast into an aluminum dish of 50 mm diameter and 10 mm thick, and cured stepwise at 60° C. for 1 hour, at 100° C. for 1 hour, and at 150° C. for 4 hours into a cured product. The cured product was measured for Shore D or Durometer Type A hardness according to JIS K 6253-3:2012.

(3) Light Transmittance of Cured Product

A concave polytetrafluoroethylene spacer of 1 mm thick was sandwiched between two slide glass plates of 50 mm×20 mm×1 mm thick and fixedly secured. The resin composition was cast into the space, and cured stepwise at 60° C. for 1 hour, at 100° C. for 1 hour, and at 150° C. for 8 hours. The cured sample was measured for light transmittance at wavelength 450 nm on a spectrometer U-4100 (Hitachi High-Technologies Corp.).

(4) Heat Resistance

The sample in test (3) was allowed to stand at 150° C. for 1,000 hours before it was measured for light transmittance at 450 nm on spectrometer U-4100.

(5) Tensile Strength and Elongation at Break of Cured Product

The resin composition was cast into a concave polytetrafluoroethylene mold of 150 mm×200 mm×2 mm thick and cured stepwise at 60° C. for 1 hour, at 100° C. for 1 hour, and at 150° C. for 8 hours. The cured sample was measured for tensile strength and elongation at break on a tensile tester EZ TEST (EZ-L by Shimadzu Corp.) according to JIS K 6251:2010 under conditions including a separation rate of 500 mm/min, a distance between grips of 80 mm, and a distance between two gage marks of 40 mm.

(6) Thermal Cycling Test

The resin composition was dispensed on a package (Tiger 3528, Shin-Etsu Chemical Co., Ltd.) and cured stepwise at 60° C. for 1 hour, at 100° C. for 1 hour, and at 150° C. for 8 hours, obtaining a test sample in the form of the package encapsulated with the cured product. On twenty test samples, a thermal cycling test (TCT) between −50° C. and 140° C. was carried out over 1,000 cycles. The number of test samples in which the encapsulant cracked was counted.

The test results are shown in Tables 3 and 4.

TABLE 1

| Amount (pbw) | Example 1 | 2 | 3 | 4 | 5 | 6 |
|---|---|---|---|---|---|---|
| (A-1) | 100 | 100 | | | | |
| (A-2) | | | 100 | | | |
| (A-3) | | | | 100 | | |
| (A-4) | | | | | 100 | 100 |
| (A-5) | | | | | | |
| (A-6) | | | | 20 | | |
| (A-7) | | | | | 20 | |
| (A-8) | 100 | | | | | |
| (A-9) | | | | 450 | | |
| (A-10) | | | | 5 | | |
| (B-1) | | | | | | |
| (B-2) | | | | | | |
| (B-3) | | 200 | | | | |
| (B-4) | | | | | 100 | 100 |
| (C) | 0.1 | 0.1 | 0.1 | 0.1 | 0.1 | 0.1 |
| (D-1) | | | | | | |
| (D-2) | | | | | | |

TABLE 2

| Amount (pbw) | Example 7 | 8 | 9 | Comparative Example 1 | 2 | 3 |
|---|---|---|---|---|---|---|
| (A-1) | | | | | | |
| (A-2) | | | | | | |
| (A-3) | | | | | | |
| (A-4) | | | | | | |
| (A-5) | 100 | | | | | |
| (A-6) | | | | | | |
| (A-7) | | | | | | |
| (A-8) | | | 100 | | | |
| (A-9) | 250 | 100 | | | | |
| (A-10) | | | | | | |
| (B-1) | | | 400 | 100 | | |
| (B-2) | | 50 | | | 50 | |
| (B-3) | | | | 100 | | |
| (B-4) | | | | | | 100 |
| (C) | 0.1 | 0.1 | 0.1 | 0.1 | 0.1 | 0.1 |
| (D-1) | | | | | | 100 |
| (D-2) | | | | | | 50 |

TABLE 3

| Test results | | Example 1 | 2 | 3 | 4 | 5 | 6 |
|---|---|---|---|---|---|---|---|
| Viscosity (Pa·s) | 23° C. | 5.4 | 3.4 | 9.6 | 3.2 | 14.3 | 16.2 |
| Hardness | Shore D | 27 | — | — | — | — | — |
| | Type A | — | 75 | 70 | 36 | 88 | 90 |
| Light transmittance [1 mm thick, 450 nm] (% T) | Initial | 99.7 | 99.6 | 99.7 | 99.7 | 99.6 | 99.6 |
| | After 150° C./ 1,000 hr | 99.3 | 99.2 | 99.4 | 99.5 | 99.3 | 99.4 |
| Tensile strength (MPa) | 25° C. | 3.3 | 2.3 | 2.1 | 2.8 | 9.8 | 10.4 |
| Elongation at break (%) | 25° C. | 130 | 160 | 160 | 200 | 90 | 80 |
| TCT (number of cracked samples) | −50° C.↔ 140° C. 1,000 cycles | 0/20 | 0/20 | 0/20 | 0/20 | 0/20 | 0/20 |

TABLE 4

| Test results | | Example 7 | 8 | 9 | Comparative Example 1 | 2 | 3 |
|---|---|---|---|---|---|---|---|
| Viscosity (Pa·s) | 23° C. | 5.8 | 4.2 | 18.3 | 3.6 | 3.8 | 6.2 |
| Hardness | Shore D | — | — | 56 | 21 | — | 23 |
| | Type A | 69 | 78 | — | — | 70 | — |
| Light transmittance [1 mm thick, 450 nm] (% T) | Initial | 99.7 | 99.8 | 99.7 | 99.7 | 99.6 | 99.6 |
| | After 150° C./ 1,000 hr | 99.1 | 99.2 | 99.3 | 99.2 | 99.3 | 99.3 |
| Tensile strength (MPa) | 25° C. | 6.7 | 8 | 6.9 | 1.8 | 6.1 | 2.4 |
| Elongation at break (%) | 25° C. | 140 | 120 | 90 | 90 | 60 | 90 |
| TCT (number of cracked samples) | −50° C.↔ 140° C. 1,000 cycles | 0/20 | 0/20 | 0/20 | 0/20 | 0/20 | 0/20 |

It is evident from Tables 3 and 4 that the curable resin compositions containing a silphenylene oligomer skeleton-bearing organosilicon compound (Examples 1 to 9) cure into products which are hard, but have acceptable elongation and satisfactory mechanical strength, in contrast to the curable resin compositions consisting of organopolysiloxanes (Comparative Examples 1 and 2). The curable resin composition containing a silphenylene monomer skeleton-bearing organosilicon compound (Comparative Example 3) cures into a product which shows improvements in hardness and elongation, but is less effective in TCT, i.e., insufficient in crack resistance, as opposed to the curable resin compositions containing a silphenylene oligomer skeleton-bearing organosilicon compound. It has been demonstrated that the resin composition containing a silphenylene oligomer skeleton-bearing organosilicon compound endows the cured product with rigidity and toughness.

The condensation curable resin composition containing a silphenylene oligomer skeleton-bearing organosilicon compound according to the invention cures into a product having satisfactory mechanical properties and heat resistance. By encapsulating a semiconductor chip with the cured resin composition, a fully reliable semiconductor package is obtained. Since the cured product has high light transmittance, the resin composition is best suited for the encapsulation of LED chips, especially blue and purple LED chips.

Japanese Patent Application Nos. 2015-249522 and 2016-028902 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A condensation curable resin composition comprising (A) a silphenylene oligomer skeleton-bearing organosilicon compound having at least two hydroxyl and/or alkoxy groups per molecule, represented by the general formula (1):

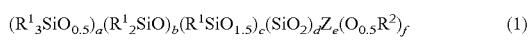

$$(R^1{}_3SiO_{0.5})_a(R^1{}_2SiO)_b(R^1SiO_{1.5})_c(SiO_2)_dZ_e(O_{0.5}R^2)_f \quad (1)$$

wherein $R^1$ is independently hydrogen or a $C_1$-$C_{12}$ unsubstituted monovalent hydrocarbon group free of aliphatic unsaturation, Z is independently a group having the formula (2):

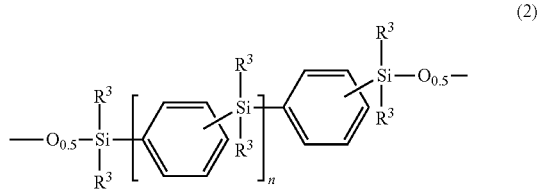

wherein $R^3$ is independently a $C_1$-$C_{12}$ unsubstituted monovalent hydrocarbon group free of aliphatic unsaturation, and n is an integer of 1 to 3, $R^2$ is independently hydrogen or a $C_1$-$C_6$ alkyl group, a is an integer of 0 to 500, b is an integer of 0 to 5,000, c is an integer of 0 to 500, d is an integer of 0 to 500, e is an integer of 1 to 500, and f is an integer of 2 to 100.

2. The composition of claim 1 wherein component (A) comprises (A-i) a silphenylene oligomer skeleton-bearing branched organosilicon compound having at least two hydroxyl and/or alkoxy groups per molecule, represented by formula (1) wherein b is an integer of 0 to 1,000, and $1 \leq c+d \leq 1,000$.

3. The composition of claim 1 wherein component (A) comprises (A-ii) a silphenylene oligomer skeleton-bearing linear organosilicon compound having hydroxyl and/or alkoxy groups at both ends of the molecular chain, represented by the general formula (3):

wherein $R^1$, $R^2$ and Z are as defined above, b' is an integer of 0 to 5,000, e' is an integer of 1 to 500, and $1 \leq b'+e' \leq 5,001$.

4. The composition of claim 1, further comprising (B) an organosilicon compound having at least two hydroxyl and/or alkoxy groups per molecule, represented by the general formula (4):

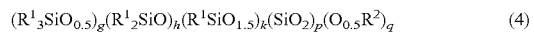

wherein $R^1$ and $R^2$ are as defined above, g is an integer of 0 to 500, h is an integer of 0 to 5,000, k is an integer of 0 to 500, p is an integer of 0 to 500, q is an integer of 2 to 100, and $1 \leq h+k+p \leq 5,000$, in an amount of 5 to 500 parts by weight per 100 parts by weight of component (A) in total.

5. The composition of claim 4 wherein component (B) comprises (B-i) a branched organosilicon compound having at least two hydroxyl and/or alkoxy groups per molecule, represented by formula (4) wherein h is an integer of 0 to 1,000, and $1 \leq k+p \leq 1,000$, in an amount of 50 to 500 parts by weight per 100 parts by weight of component (A) in total.

6. The composition of claim 4 wherein component (B) comprises (B-ii) a linear organosilicon compound having hydroxyl and/or alkoxy groups at both ends of the molecular chain, represented by the general formula (5):

wherein $R^1$ and $R^2$ are as defined above, and h' is an integer of 1 to 5,000, in an amount of 5 to 200 parts by weight per 100 parts by weight of component (A) in total.

7. The composition of claim 1, further comprising (C) a condensation catalyst.

8. A semiconductor package encapsulated with a cured product of the condensation curable resin composition of claim 1.

* * * * *